United States Patent [19]

Dilts et al.

[11] Patent Number: 4,617,420

[45] Date of Patent: Oct. 14, 1986

[54] FLEXIBLE, INTERCONNECTED ARRAY OF AMORPHOUS SEMICONDUCTOR PHOTOVOLTAIC CELLS

[75] Inventors: David A. Dilts, Gates Mills; Timothy W. Brauneck, Thompson, both of Ohio

[73] Assignee: The Standard Oil Company, Cleveland, Ohio

[21] Appl. No.: 749,832

[22] Filed: Jun. 28, 1985

[51] Int. Cl.[4] .................. H01L 25/02; H01L 31/18
[52] U.S. Cl. ..................................... 136/244; 29/572
[58] Field of Search .................. 136/244, 258 AM; 29/572, 589, 591

[56] References Cited

U.S. PATENT DOCUMENTS

| | | | |
|---|---|---|---|
| 2,938,938 | 5/1960 | Dickson, Jr. | 136/244 |
| 3,116,171 | 12/1963 | Nielsen et al. | 136/245 |
| 3,340,096 | 9/1967 | Mann et al. | 136/244 |
| 3,346,419 | 10/1967 | Webb | 136/244 |
| 3,369,939 | 2/1968 | Myer | 136/246 |
| 3,375,141 | 3/1968 | Julius | 136/244 |
| 3,418,170 | 12/1968 | Amsterdam et al. | 136/244 |
| 3,459,597 | 8/1969 | Baron | 136/244 |
| 3,575,721 | 4/1971 | Mann | 136/244 |
| 3,769,091 | 10/1973 | Leinkram et al. | 136/246 |
| 4,236,937 | 12/1980 | Wihl | 136/246 |
| 4,525,593 | 6/1985 | Yablonovitch | 136/255 |

FOREIGN PATENT DOCUMENTS

| | | | |
|---|---|---|---|
| 54-157038 | 6/1981 | Japan | 136/244 |
| 59-03980 | 1/1984 | Japan | 136/244 |

Primary Examiner—Aaron Weisstuch
Attorney, Agent, or Firm—Jeffrey A. Wyand; Joseph G. Curatolo; Larry W. Evans

[57] ABSTRACT

A flexible, photovoltaic panel composed of photovoltaic strips, each strip having a flexible conducting substrate, an amorphous semiconductor body deposited on the substrate, a transparent conductive coating deposited on the semiconductor body, and a current collection grid on the coating, is formed by joining strips along overlapping lengthwise margins with a flexible plastic tape. The tape may contain one or more conducting paths contacting the current collecting grid on an overlapped strip and the substrate of an overlapping strip to electrically interconnect the strips in series. Photovoltaic cells in each strip are electrically connected in parallel, so that interconnected panels may be designed with a wide range of voltage and current outputs.

13 Claims, 10 Drawing Figures

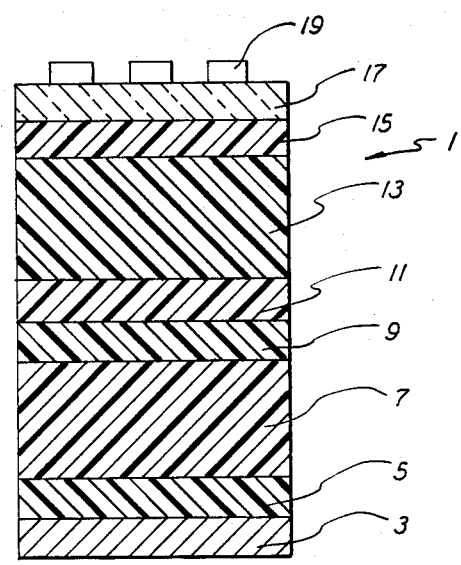
FIG. 1
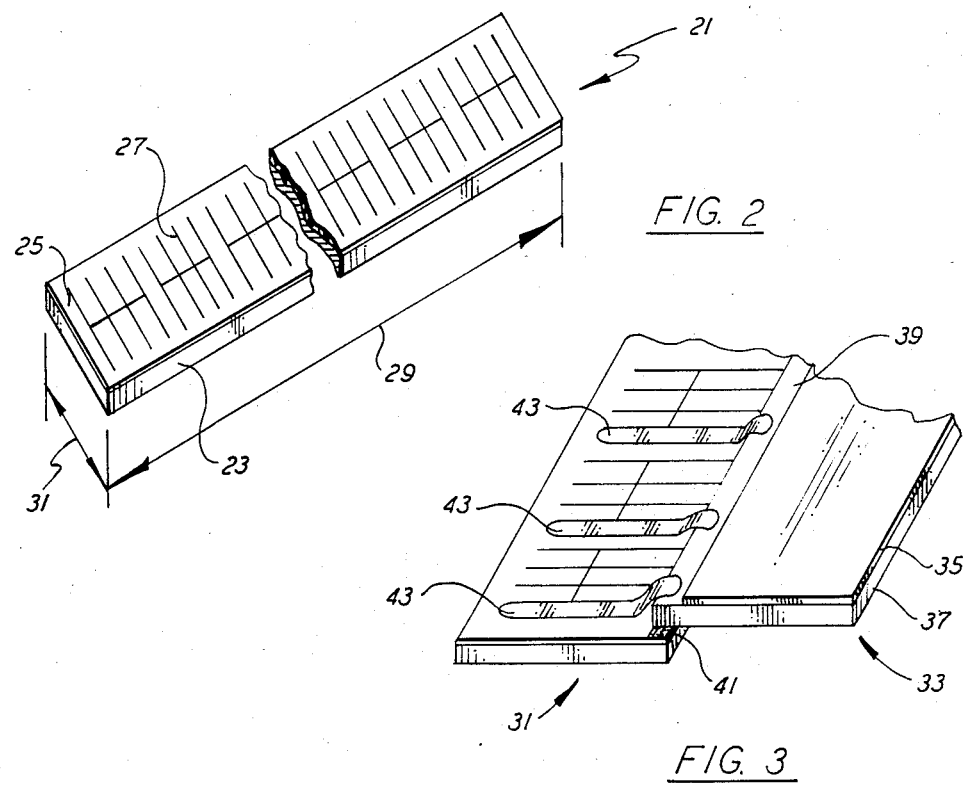
FIG. 2
FIG. 3

FLEXIBLE, INTERCONNECTED ARRAY OF AMORPHOUS SEMICONDUCTOR PHOTOVOLTAIC CELLS

BACKGROUND

The technology for manufacture of amorphous silicon photovoltaic cells has been developed over the past ten years. It is now known how to deposit electronic device quality amorphous silicon by compensating defects with hydrogen and/or fluorine. This high quality amorphous silicon may be deposited on thin flexible substrates such as a plastic or stainless steel. Large area amorphous silicon photovoltaic cells, consisting of one or more p-i-n structures formed from successively deposited layers, may be continuously produced on very long flexible substrates. See, for example, U.S. Pat. Nos. 4,400,409 and 4,410,558 to Izu, Cannella, and S. R. Ovshinsky, and U.S. Pat. No. 4,485,125 to Izu and H. C. Ovshinsky, the disclosures of which are incorporated herein by reference. These patents teach the continuous deposition of shingle and multiple p-i-n structures in sheet form, 25 cm. or more in width and hundreds of meters long. These sheets must be processed further to prepare working photovoltaic cells and interconnected arrays of such cells to produce operational photovoltaic panels.

A number of methods for defining separate photovoltaic cells from deposited sheet structures and for electrically interconnecting those cells have been proposed. Examples of such methods are disclosed in U.S. Pat. No. 4,419,530 to Nath, U.S. Pat. No. 4,443,652 to Izu, Nath and Holland, U.S. Pat. No. 4,485,264 to Izu and Nath and U.S. Pat. No. 4,514,579 to Hanak, the disclosures of which are incorporated herein by reference. In general, a transparent conductive oxide is deposited on the sheets to form one electrode of the cells and a metallic grid of conductors is deposited on the oxide to collect current from the oxide electrode efficiently. The conductive substrate forms a second electrode of the cells or interconnected array. By etching the semiconductor layers, individual cells may be defined and electrically connected in parallel. By interposing an insulator between the substrate and semiconductor body, the etching and grid patterns may be used to form series interconnected or series-parallel interconnected arrays of cells.

Alternatively, the sheet product of the continuous deposition process may be severed into strips, i.e. pieces having a longer length than width, that are interconnected mechanically and electrically into photovoltaic panels. When such panels are placed into service they are subjected to various environmental influences such as temperature variations and wind loading. Rigid interconnection of strips of cells has been proposed, but rigid panels may fail under environmental influences. Therefore, it is important that a panel formed of interconnected strips be flexible to avoid opening of electrical circuits in response to mechanical stress. While strips of amorphous silicon solar cells deposited on stainless steel are themselves flexible, at least around an axis perpendicular to their length, it is important that a panel assembled from strips be flexible both along its length and width.

SUMMARY OF THE INVENTION

In the invention, a panel of strips of solar cells are interconnected, mechanically and electrically, so that the panel may flex both in length and width. The strips are formed by severing a continuous sheet of photoresponsive material deposited on a substrate, preferably stainless steel, and preferably coated with a conductive oxide, into relatively long and relatively narrow strips. The strips are then joined in turn to each other along their lengths in overlapping fashion much like shingles on a roof. One strip has adhered to its top surface along a lengthwise edge, a flexible plastic, preferably in a tape form. Another strip is overlapped along one of its lengthwise edges over the first strip and the length of plastic is adhered to the bottom of the overlapping strip. The process is repeated as often as necessary to make a panel of the desired size. Because of the natural resiliency of the plastic, the panel can flex around an axis along the length of the strips. The strips are naturally flexible around an axis perpendicular to their length.

The electrical connections between joined strips may be made in various alternative ways. In one embodiment, the semiconductor body is removed from the longitudinal margin of an overlapping strip to expose the substrate along the edge of that strip. A conductive stripe is deposited on the exposed substrate of the overlapping strip extending to and contacting the conductive oxide of the overlapped strip. Another embodiment that results in no net loss of active, exposed photovoltaic area uses a length of plastic that contains an electrical conductor. The conductor is preferably an integral part of the plastic, either in discrete conducting paths transverse to the length of the plastic or continuously along the length of the plastic. The conducting path or paths in the plastic are disposed to contact the grid on an overlapped strip and complete the connection by contacting the substrate of the overlapping strip. Either embodiment provides series connections between strips. Since each strip contains a number of cells having common electrodes, i.e. connected in parallel, a series-parallel connection is achieved. As a result, the invention permits photovoltaic panels of nearly any desired, reasonable combination of voltage and current capacities to be designed.

The invention is best understood with reference to particular embodiments shown in schematic form in the drawings.

BRIEF DESCRIPTION OF THE DRAWINGS

FIG. 1 is a cross-sectional schematic view of multiple cell photovoltaic structure.

FIG. 2 is a perspective view of a portion of a strip of photoresponsive material deposited on a conducting substrate.

FIG. 3 is a partial, cross-sectional perspective view of two strips of photovoltaic cells joined according to one embodiment of the invention.

DETAILED DESCRIPTION OF PREFERRED EMBODIMENTS

Figure 4:
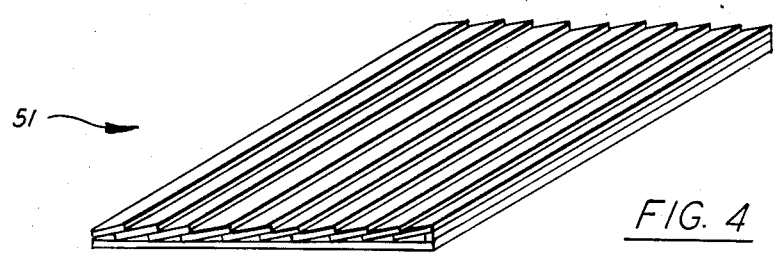
FIG. 4 is a perspective view of a photovoltaic panel according to an embodiment of the invention.

A typical amorphous silicon based photovoltaic cell 1 is shown in cross section in FIG. 1. Cell 1 is deposited on a substrate 3, preferably stainless steel, as a series of amorphous silicon layers of differing conductivity types. A layer 5 deposited on substrate 3 may be p-type or n-type depending on the type of dopant co-deposited with the silicon. An intrinsic type layer 7 is deposited on layer 5 and another doped layer 9 is deposited on intrinsic layer 7. Layer 9 is of the opposite conductivity type from layer 5 so that a p-i-n cell is formed where the p-type layer may be layer 5 or layer 9. When the first cell is amorphous silicon, one or more of the layers of this first cell may contain an ingredient, such as germanium, narrowing the band gap of the amorphous silicon to adjust the spectral response of the cell.

A second cell of the same type formed by layers 5, 7, and 9 is formed on top of the first cell. A layer 11 deposited on layer 9 is of the same conductivity type as layer 5. A second intrinsic type layer 13 is deposited on layer 11 followed by layer 15 of the same conductivity type as layer 9. When this second cell is amorphous silicon, one or more of the layers of this second cell may contain an ingredient, such as nitrogen or carbon, widening the band gap of the amorphous silicon to adjust the spectral response of the cell.

Intrinsic layers 7 and 13 where most generation of charge carriers takes place are much thicker than the other amorphous silicon layers, but FIG. 1 is not drawn to scale.

A transparent electrically conductive layer 17, such as indium tin oxide, is deposited on layer 15 to form an electrode of the dual cell structure. Substrate 3 serves as the other electrode of the structure. A metallic grid 19 is disposed on transparent layer 17 to collect without excessive ohmic losses the photocurrent generated by the structure in response to light falling on layer 17. As is known in the art, multiple cell structures as shown in FIG. 1 produce an enhanced power output if designed so that each cell generates approximately the same current. The photovoltages of the cells approximately add to produce the total structure output voltage. More than two cells may be stacked to maximize power output as shown, for example, in U.S. Pat. No. 4,479,028. In addition, the cells may be constructed of numerous photoresponsive materials and are not limited to amorphous silicon.

As noted above, such photoresponsive semiconductor bodies containing various junctions as shown in FIG. 1 can be continuously deposited over large areas on thin, flexible substrates of stainless steel or other materials. Those large areas of substrate and photoresponsive semiconductor may be cut by metal shears, water jets, etc. into smaller pieces such as strip 21 shown in FIG. 2. Strip 21 has a flexible substrate 23 on which a semiconductor body 25 is deposited including a transparent top layer with a metallic grid 27 deposited on it. Strip 21 has a length 29 greater than its width 31. As in the other figures, relative dimensions are distorted in FIG. 2 for clarity. Semiconductor body 25 is typically several hundred nanometers in thickness, whereas substrate 23 may be on the order of 0.15 mm thick.

In FIG. 3 two strips of the type shown in FIG. 2 are depicted with a mechanical and electrical interconnection according to an embodiment of the invention. In FIG. 3, an overlapped strip 31 is shown to be below and partially covered by an overlapping strip 33. Strip 31 and 33 are initially in the same state as strip 21 of FIG. 2. Overlapping strip 33 is shown without a current collecting grid for clarity. Strip 33 has semiconductor body 35 deposited on the top surface of its substrate 37. Along a lengthwise margin 39 of strip 33, semiconductor body 35 has been removed, for example by chemical etching, to expose the top surface of substrate 37. On the bottom surface of substrate 37, opposite margin 39, a length of a plastic material 41 has been adhered to strip 33. Preferably plastic 41 is in the form of tape that is sticky on both sides. Tape 41 preferably is resilient and remains pliable over the temperature range to which a photovoltaic panel may be exposed. We have found that a commercially available tape sold by Minnesota Mining and Manufacturing Company under the trademark Iso-Tac is suitable for this application.

After one side of tape 41 is adhered to the bottom surface of substrate 37, the opposite side of tape 41 is adhered to the top of and along a lengthwise margin of strip 31. The semiconductor body on strip 31 may be removed along this lengthwise margin or may remain intact. As shown in FIG. 3, strips 31 and 33 mutually overlap above and below tape 41. The tape forms a mechanical joint between strips 31 and 33. In order to establish electrical connections between the strips, conductive stripes 43 are deposited on the conductive oxide layer on strip 31 and extend across the junction of the strips onto margin 39 of strip 33. Three stripes 43 are shown, but any number may be used consistent with the amount of the current to be conducted and minimizing shadowing of the underlying photocell. As shown, the stripes may contact the current grid on overlapped strip 31.

Stripes 43 may be deposited by such methods as silk screening, low temperature evaporation, plating, roll printing, or any other method by which an adherent, high conductivity material may be deposited. The stripes connect the top surface and/or current collecting grid of strip 31 to substrate 37 of strip 33. That is, they form series electrical connections so that the photovoltages generated by strips 31 and 33 add. As shown on the drawings, all cells on a strip, each cell now being considered to be defined by one unit of the current collecting grid, have as common terminals the substrate and conductive oxide layer. That is, in each strip the cells are connected in parallel so their photocurrents add. Additional strips may be connected together in the manner shown, much like shingles on a roof. The more strips so connected the larger the output photovoltage. Likewise, the longer the strips, the greater the output photocurrent. Therefore, subject to the practicalities of making a photovoltaic panel of manageable size, the invention permits design of such panels with a wide range of current/voltage capabilities. Such a panel 51 is shown schematically in FIG. 4. The drawing is exaggerated to illustrate construction of the panel. Such a panel actually appears to be flat since each strip is raised at its edge only by a few tenths of a millimeter.

The panel of FIG. 4 is flexible around an axis transverse to its length because of the natural flexibility of the substrate. The panel is also flexible around an axis along its length because of the flexibility of tape 41. Therefore, the panel can readily withstand hostile temperature and wind loading environments.

The embodiment of FIG. 3 is expensive in terms of the amount of active area of photoresponsive material that is removed or shadowed. The shadowing by the current collecting grid cannot be avoided. In addition, potentially useful photovoltaic material is lost along the margin of strip 33 and shadowed along the margin of strip 31 and by stripes 43. The resulting losses reduce the effective efficiency of the panel.

Figure 5A:
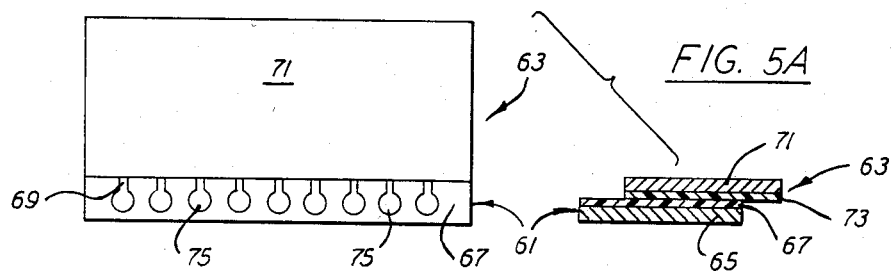
FIGS. 5A, 5B and 5C are each top and end views of various steps in a method of assembling two strips of photovoltaic cells according to one embodiment of the invention.
Figure 5B:
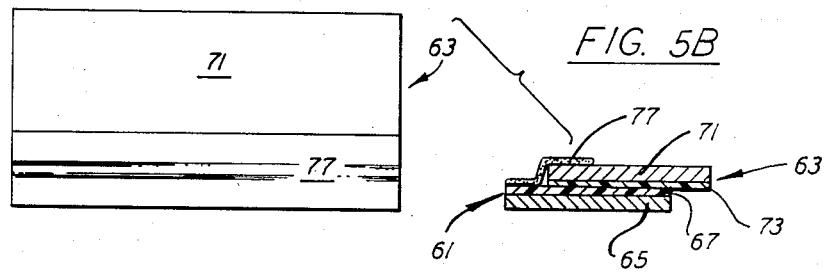

An alternative embodiment of the invention is illustrated in FIG. 5 which shows three steps in its construction. As shown in FIG. 5A, in top view on the left and side view on the right, two strips 61 and 63 of photovoltaic material are disposed face-to-face in an offset arrangement. Strip 61 has a substrate 65 on which a photoresponsive semiconductor body 67 is deposited and a metallic collection grid 69 on top of body 67. A second strip 63 having a substrate 71 and photoresponsive semiconductor body 73 is placed on strip 61 so that semiconductor bodies 67 and 73 are in contact. The lengthwise edges of the strips are aligned, but are not in the same plane so that part of grid 69 is exposed. Grid 69 preferably includes enlarged contact pads 75, although such pads are not essential. As shown in FIG. 5B in top and end views, a tape 77 having one or more conducting paths on one surface, as further explained with reference to FIG. 6, is adhered to strips 61 and 63 to contact pads 75 and substrate 71 both mechanically and electrically.

Figure 5C:
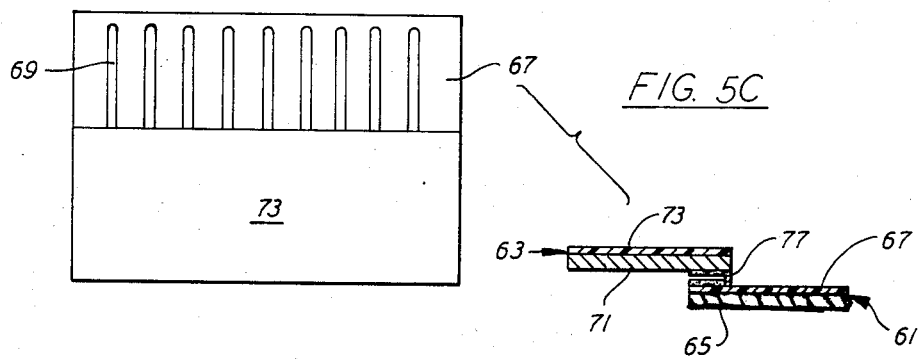

Using tape 77 as a hinge, strip 63 is then rotated so that both semiconductor bodies 67 and 73 are exposed on the same side of the structure. The result of this step is shown in FIG. 5C in top and side views. As with many of the other figures, the dimensions in FIG. 5 are not to scale, but are drawn to illustrate the invention. No current collecting grid is shown on strip 63, although such a grid would preferably be used. The process depicted in FIG. 5 can be repeatedly used to form a photovoltaic panel from many strips. A particular advantage of this embodiment of the flexible panel over the one previously described is the reduction in unproductive photoresponsive semiconductor area. The only net area lost in the embodiment of FIG. 5 is that shadowed by the current collection grid since the shadowed portion of strip 61 is covered by the active area of strip 63.

Figure 6A:
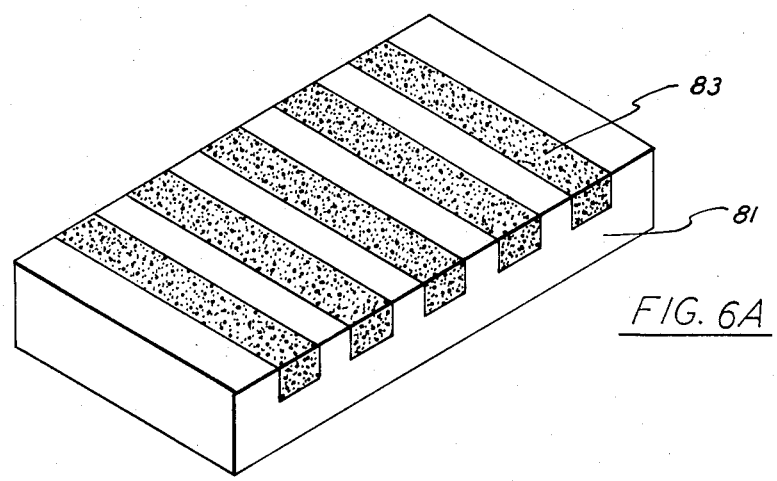
FIGS. 6A, 6B, and 6C are perspective views of various embodiments of lengths of plastic including conducting paths that may be used in embodiments of the invention.
Figure 6B:
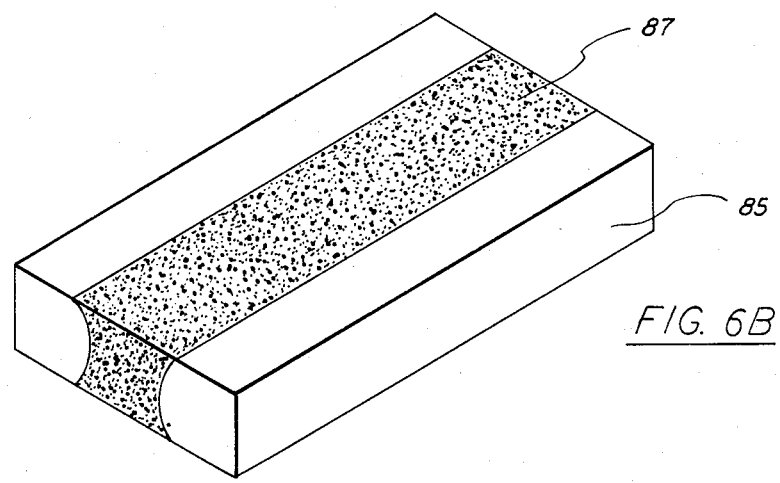

In FIG. 6, a number of different embodiments of a tape, such as tape 77, for adhering strips together mechanically and achieving electrical contact are shown. In FIG. 6A, a tape 81 is shown that has embedded in one surface a plurality of conducting paths 83. The spacing of these paths is chosen to be the same as the spacing of the grid lines they are to contact, such as grid lines 69 and pads 75 of FIG. 5. An adhesive may be applied to all non-conducting areas of tape 81 to obtain good adherence between the tape and photovoltaic strips. When tape 81 is used, it is necessary to dispose paths 83 in registration with the grid lines and/or contact pads formed at the ends of grid lines. A second tape embodiment 85 shown in FIG. 6B includes a continuous conductor 87 in the central portion of the tape and extending along its length. Tape 87 provides an advantage over the embodiment of FIG. 6A in that the folding step of FIG. 5 can be avoided. Rather, tape 87 can be applied directly to one strip such as strip 61 of FIG. 5A and another strip, such as strip 63, can be placed directly on tape 87 to achieve the embodiment of FIG. 5C, but without a fold in the tape. Tape 87 also avoids the necessity of registering mutually insulated conducting paths with grid lines as is required with tape embodiment 85. The apparent short circuiting of photovoltaic cells by conductor 87 does not adversely affect performance of amorphous silicon cells. The active layers and transparent oxide coating in typical amorphous silicon photovoltaic cells are so thin that their lateral resistance forms a natural isolation between individual cells.

Figure 6C:
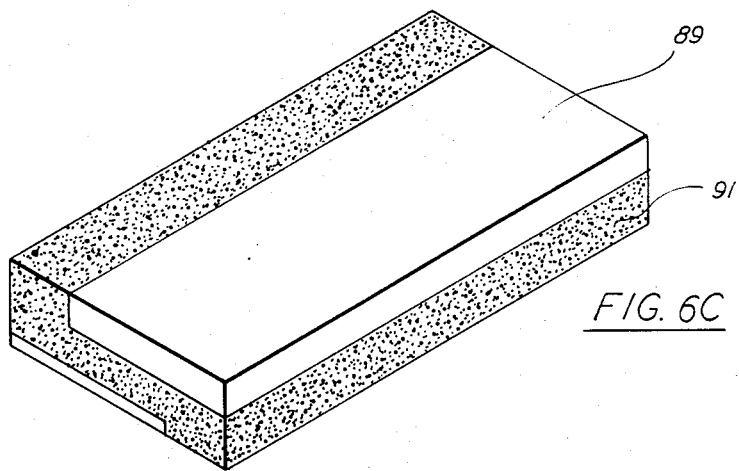

A more complex tape embodiment 89 is shown in FIG. 6C. A conducting path 91 occupying a portion of one surface of the tape enters the body of the tape and passes along the width of the tape and emerges along a portion of the opposed surface. Like the embodiment of FIG. 6B, tape 89 needs no folding to contact opposing surfaces and can be applied in a modified FIG. 5 process without the folding step. Conducting path 91 extends the length of tape 89 so that no registration of conducting paths with grids lines or contact pads is needed.

The invention has been described with respect to certain preferred embodiments to which various additions and modifications may be made by one of skill in the art without departing from the spirit of the invention. Therefore, the scope of the invention is limited solely by the following claims.

We claim:

1. A flexible interconnected array of solar cells, comprising at least two strips of photoelectric cells, each of said strips having a width and a length, said length being longer than said width, and including an electrically conductive substrate for forming one electrode of said array, said substrate having opposed top and bottom surfaces, a photoresponsive semiconductor body disposed on one surface of said substrate, and a transparent conductive coating disposed on said semiconductor body opposite said substrate, a portion of the bottom surface of the substrate of one strip overlapping a portion of the coating on an adjacent, overlapped strip along the lengths of said overlapping and overlapped strips, said strips being flexibly joined in their mutually overlapping portions by a length of a flexible plastic adhered to the bottom surface of the substrate of said overlapping strip and to the coating of said adjacent overlapped strip, and wherein said substrate of said overlapping strip is free of said semiconductor body along the margin of its length overlapping said adjacent overlapped strip and at least one conducting stripe is disposed on said coating of said overlapped strip along its width, continuously extending to and contacting said margin of said overlapping strip to interconnect said strips electrically.

2. A flexible interconnected array of solar cells, comprising at least two strips of photoelectric cells, each of said strips having a width and a length, said length being longer than said width, and including an electrically conductive substrate for forming one electrode of said array, said substrate having opposed top and bottom surfaces, a photoresponsive semiconductor body disposed on one surface of said substrate, and a transparent conductive coating disposed on said semiconductor body opposite said substrate, a portion of the bottom surface of the substrate of one strip overlapping a portion of the coating on an adjacent, overlapped strip along the lengths of said overlapping and overlapped strips, said strips being flexibly joined in their mutually overlapping portions by a length of a flexible plastic adhered to the bottom surface of the substrate of said overlapping strip and to the coating of said adjacent overlapped strip, and wherein at least one conducting stripe is disposed on said coating of said overlapped strip along its width and said length of flexible plastic includes at least one electrically conducting path transverse to the length of said plastic, said at least one path being disposed in electrical contact with said at least one conducting stripe on said overlapped strip and with the substrate of said overlapping strip to interconnect said strips electrically.

3. A flexible interconnected array of solar cells comprising at least two strips of photoelectric cells, each of said strips having a width and a length, said length being longer than said width, and including an electrically conductive substrate for forming one electrode of said array, said substrate having opposed top and bottom surfaces, a photoresponsive semiconductor body disposed on one surface of said substrate, and a transparent conductive coating disposed on said semiconductor body opposite said substrate, a portion of the bottom surface of the substrate of one strip overlapping a portion of the coating on an adjacent, overlapped strip along the lengths of said overlapping and overlapped strips, said strips being flexibly joined in their mutually overlapping portions by a length of a flexible plastic adhered to the bottom surface of the substrate of said overlapping strip and to the coating of said adjacent overlapped strip, wherein at least one conducting stripe is disposed on said coating of said overlapped strip along its width and said length of flexible plastic includes a conducting path along the length of said plastic, said path being disposed in electrical contact with said at least one stripe on said overlapped strip and with the substrate of said overlapping strip to interconnect said strips electrically.

4. A process for interconnecting a flexible array of photoresponsive cells from at least two continuous strips of cells, each strip having a width and a length, said length being longer than said width, an electrically conductive substrate having opposed top and bottom surfaces, a photoresponsive semiconductor body disposed on the top surface of said substrate and a transparent conductive coating disposed on said semiconductor body opposite said substrate, said process comprising removing from the top surface of a first of said strips a portion of said semiconductor body and coating along a lengthwise margin of said first strip to expose the underlying top surface of said substrate, adhering a length of a flexible plastic to the bottom surface of said substrate of said first strip opposite said exposed portion, adhering said length of plastic to the transparent conductive coating of a second strip along a marginal length of said second strip so that only a portion of said strips overlap.

5. The process of claim 4 including depositing at least one continuous, conductive stripe on and extending from said exposed portion of said first strip to and in contact with the coating on said second strip to interconnect said strips electrically.

6. The process of claim 5 including depositing said at least one stripe by screen printing.

7. The process of claim 5 including depositing a plurality of generally parallel conductive stripes on said first and second strips extending from said exposed portion of said first strip to and in contact with the coating on said second strip to interconnect said strips electrically.

8. The process for interconnecting a flexible array of photoresponsive cells from at least two continuous strips of cells, each strip having a width and a length, said length being longer than said width, an electrically conducting substrate having opposed top and bottom surfaces, a photoresponsive semiconductor body disposed on the top surface of said substrate, a transparent conductive coating disposed on said semiconductor body opposite said substrate, said process comprising depositing at least one conducting stripe on a first strip along its width, adhering to said first strip along a lengthwise margin of said first strip a length of a flexible plastic and adhering said plastic to the bottom surface of the substrate of a second strip along a lengthwise margin of said second strip.

9. The process of claim 8 wherein said length of plastic includes at least one electrically conducting path disposed transversely to the length of said plastic, said process including disposing said path in contact with said at least one conducting stripe on said first strip and said substrate of said second strip to interconnect said strips electrically.

10. The process of claim 8 wherein said length of plastic includes a conducting path along the length of said plastic, and said process includes disposing said conducting path in electrical contact with said at least one stripe on said overlapped strip and with said substrate of said overlapping strip to interconnect said strips electrically.

11. The process of claim 8 including depositing said at least one stripe by screen printing.

12. The process of claim 8 wherein a plurality of generally parallel conductive stripes are deposited on said coating on said first strip.

13. The process of claim 12 wherein said length of plastic includes a plurality of mutually insulated conducting paths disposed transversely to said length, said process including aligning at least two of said conducting paths in registration with said stripes on said first strip, contacting each aligned with a stripe and connecting each said path to said substrate of said second strip to interconnect said strips electrically.

* * * * *